(12) United States Patent
Ushijima et al.

(10) Patent No.: US 6,565,773 B2
(45) Date of Patent: May 20, 2003

(54) CONDUCTIVE PASTE

(75) Inventors: Hitoshi Ushijima, Shizuoka (JP);
Yoshinobu Akiha, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/818,631

(22) Filed: Mar. 28, 2001

(65) Prior Publication Data

US 2001/0039309 A1 Nov. 8, 2001

(30) Foreign Application Priority Data

Mar. 28, 2000 (JP) ........................................ 2000-089332

(51) Int. Cl.$^7$ ............................. H01B 1/22; C08K 3/10; C22B 15/00
(52) U.S. Cl. .................. 252/514; 252/512; 524/413; 524/434; 524/435; 524/440; 75/10.43; 75/10.45; 75/10.59; 75/343; 75/392; 75/429; 75/638; 75/641
(58) Field of Search ................. 524/413, 434, 524/435, 440; 252/512, 514; 75/10.43, 10.45, 10.59, 343, 392, 429, 638, 641

(56) References Cited

U.S. PATENT DOCUMENTS

| | | | | |
|---|---|---|---|---|
| 3,918,962 A | * | 11/1975 | Dubeck et al. | 75/429 |
| 4,582,661 A | * | 4/1986 | Ito et al. | 252/512 |
| 5,141,982 A | * | 8/1992 | Oku et al. | 524/432 |
| 5,399,295 A | * | 3/1995 | Gamble et al. | 252/511 |
| 6,013,709 A | * | 1/2000 | Masuyama et al. | 524/224 |
| 6,177,585 B1 | * | 1/2001 | Chen et al. | 556/479 |
| 6,376,057 B1 | * | 4/2002 | Akao et al. | 428/215 |

FOREIGN PATENT DOCUMENTS

| | | |
|---|---|---|
| GB | 2198734 A | 6/1988 |
| JP | 60228576 | 11/1985 |
| JP | 62197473 | 9/1987 |
| JP | 2250203 | 10/1990 |
| JP | 4328146 | 11/1992 |

* cited by examiner

*Primary Examiner*—Robert Dawson
*Assistant Examiner*—Jeffrey B. Robertson
(74) *Attorney, Agent, or Firm*—Morgan, Lewis & Bockius LLP

(57) ABSTRACT

There is provided conductive paste wherein conductive fillers composed of copper micro-fibers are mixed into thermoplastic resin or thermosetting resin.

2 Claims, 3 Drawing Sheets

CONDUCTIVE PASTE

BACKGROUND OF INVENTION

1. Field of Invention

The present invention relates to conductive paste, and particularly relates to conductive paste which has excellent conductivity or excellent electromagnetic-wave shielding properties.

2. Related Art

Recently, with the development of electronic equipment or the like, there have arisen problems such as the influence of electromagnetic waves generated from the electronic equipment or the like on human bodies, or the pollution of the environment caused by harmful substances such as solder or the like at the time of scrapping the electronic equipment or the like. In order to solve such problems, there have been developed electromagnetic wave shielding materials in which conductive fillers composed of metal, carbon, etc., are mixed into synthetic resin, or conductive paste which uses no lead.

For example, conductive paste in which copper-powder conductive fillers of atomized copper powder, electrolytic copper powder, or the like, are mixed into synthetic resin, is known well. In such conductive paste, a large quantity of conductive fillers must be mixed in order to obtain satisfactory electromagnetic wave shielding properties or satisfactory conductivity. Thus, there is a problem that the material cost is increased. In addition, such conductive paste becomes so heavy in weight that there is a problem that it is inferior in easiness in handling.

SUMMARY OF INVENTION

In consideration of the foregoing circumstances, it is an object of the present invention to provide conductive paste which is superior in electromagnetic wave shielding properties or conductivity in spite of the small loading of the conductive fillers.

In order to achieve the above object, according to the present invention, there is provided conductive paste wherein conductive fillers composed of copper micro-fibers are mixed into thermoplastic resin or thermosetting resin.

The conductive paste according to the present invention exhibits higher electric conductivity with a smaller loading of conductive fillers than conventional conductive paste in which copper powder conductive fillers of atomized copper powder, electrolytic copper powder, or the like, are mixed into synthetic resin. In addition, the conductive paste according to the present invention is also superior in electromagnetic wave shielding effect. The reason for this is guessed as follows. That is, conductive fillers obtained from copper micro-fibers have a fine fibrous form. Thus, the conductive fillers are dispersed into resin so as to be intertwined with one another. Therefore, the conductive fillers have many contact points with one another. Further, such a contact condition of the conductive fillers is kept so that a larger number of conductive paths than those in the conventional conductive paste are formed.

DETAILED DESCRIPTION OF PREFERRED EMBODIMENTS

The present invention will be described below in detail.

Thermoplastic resin or thermosetting resin for use in conductive paste according to the present invention is not limited specifically. Known thermoplastic resin or thermosetting resin for use in conventional conductive paste may be used selectively suitably in accordance with the application, the required solid state properties, or the like. Examples of thermoplastic resin include vinyl chloride resin, vinyl acetate resin, polyester resin, acrylic resin, polycarbonate resin, polyamide resin, polyacetal resin, polystyrene resin, polyolefin resin such as polyethylene resin, etc. On the other hand, examples of thermosetting resin include epoxy resin, phenol resin, polyurethane resin, melamine resin, unsaturated polyester resin, silicone resin, urea resin, etc.

Figure 4:
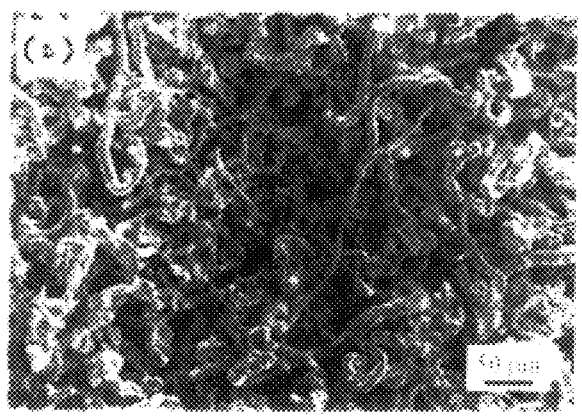
FIG. 4 is an electron micrograph of copper micro-fibers.

Copper micro-fibers for use as conductive fillers in the present invention, which are shown in the electron micrograph of FIG. 4, have fine fibrous bodies with an average fiber diameter of from 0.1 $\mu$m to 25 $\mu$m and an average fiber length of not longer than 4 cm. The copper fibers generally have bends, constrictions, branches, etc. For example, cuprous chloride is reduced by carbon black in coexistence with water vapor so that such copper micro-fibers can be obtained in high yields.

In the present invention, the copper micro-fibers are crushed for use as conductive fillers (hereinafter referred to as "copper micro-fiber fillers"). As for the shape of the copper micro-fiber fillers, in consideration of dispersibility in resin, or the like, it is preferable that the average fiber diameter is set to be in a range of from 0.1 $\mu$m to 25 $\mu$m and the average fiber length is set to be approximately in a range of from 1 $\mu$m to 1,000 $\mu$m. The loading of the copper micro-fiber fillers is established suitably in accordance with required electric conductivity.

The conductive paste according to the present invention can be obtained easily by blending and mixing the copper micro-fiber fillers into the thermoplastic resin or the thermosetting resin suitably by known mixing means. In addition, the obtained conductive paste can be suitably used for applications in various fields as electromagnetic wave shielding material, conductive paste, or the like, in the same manner as conventional conductive paste.

EXAMPLE

The present invention will be described below more specifically on the basis of Example 1 and Comparatives 1 and 2, but the present invention is not limited to the following Example.

Preparation of Copper Micro-Fibers 99 g of cuprous chloride (CuCl, purity of 99.9%, made by WAKO PURE CHEMICAL INDUSTRIES, LTD.) and 12 g of carbon black (Ketjenblack EC, made by LION CORP.) were mixed homogeneously in an agate mortar. The mixture was put into an alumina boat (300 mm long), and the alumina boat was set in a soaking portion of a reaction tube (inner diameter of 70 mm) in a tubular electric furnace. As soon as the temperature of the soaking portion reached 80° C., argon gas which had undergone bubbling in distilled water at 80° C. was circulated at the rate of 200 cm$^3$/min so as to feed water vapor to the reaction system. Next, the temperature of the soaking portion was increased to 630° C. at the temperature rising rate of 5° C./min, and reaction was produced in the soaking portion for 20 hours. A reaction mixture obtained thus was put into a beaker having 1,000 cm$^3$ of distilled water therein. By use of a homogenizer, copper micro-fibers were produced. When the copper micro-fibers were disentangled from entanglements, the copper micro-fibers were separated from the carbon black easily. Then, 400 cm$^3$ of benzene was added, and ultrasonic stirring/dispersing was further carried out. As a result, the copper micro-fibers and unreacted CuCl were substantially perfectly separated from the carbon black so that the copper micro-fibers and unreacted CuCl were on the distilled water side while the carbon was on the benzene side. Next, the copper micro-fibers in the distilled water were separated by filtration under reduced pressure. The separated copper micro-fibers were dried in a decompressed nitrogen gas atmosphere. Further, the dried copper micro-fibers were subjected to hydrogen reduction treatment at 400° C. for 1 hour. Through the reduction treatment, a trace of CuCl adhering to the fibers were reduced to Cu.

Example 1 and Comparatives 1 and 2

Preparation of Conductive Paste

The copper micro-fibers obtained thus were shredded for 5 seconds by a two-blade mixer, passed and gathered through a 63 μm-aperture-size mesh in a sonic classifier. Copper micro-fiber fillers were obtained thus. The copper micro-fiber fillers had a fiber diameter of from 10 μm to 20 μm and an average fiber length of 28.32 μm.

Figure 5A:
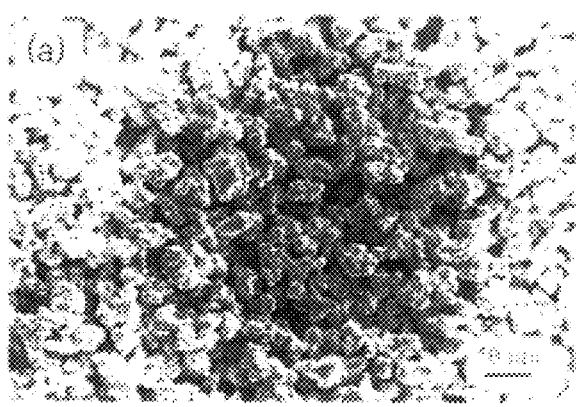
FIGS. 5A and 5B show electron micrographs of atomized copper powder and electrolytic copper powder used in Comparatives, respectively.
Figure 5B:
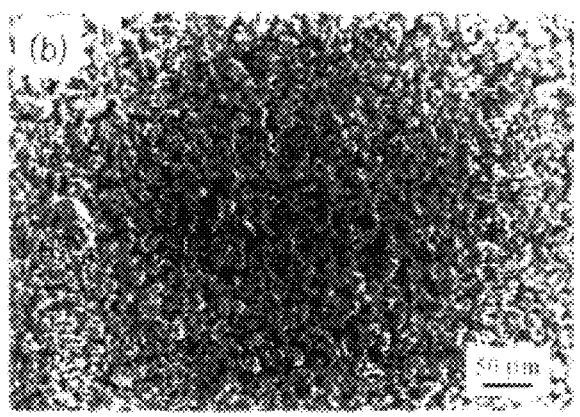

The copper micro-fiber fillers were added to liquefied resole phenol resin (PL-4348, made by GUNEI CHEMICAL INDUSTRY CO., LTD.) while the loading of the copper micro-fiber fillers was changed. The resin and the copper micro-fiber fillers were passed through a three-roll mill five times so as to be mixed. Conductive paste was prepared thus (Example 1). In addition, for comparison, commercially available atomized copper powder (Cu—At-350, made by FUKUDA METAL FOIL & POWDER CO., LTD., and having an average particle size of 17.64 μm) (Comparative 1) and commercially available electrolytic copper powder (FCC-SP-99, made by FUKUDA METAL FOIL & POWDER CO., LTD., and having an average particle size of 11.69 μm) (Comparative 2) were used to prepare conductive paste in the same manner. Incidentally, the atomized copper powder and the electrolytic copper powder had been subjected to hydrogen reduction treatment and shredding/classifying operation in order to make the conditions be the same as those of the copper micro-fiber fillers. FIG. 5A shows an electron micrograph of the atomized copper powder, and FIG. 5B shows an electron micrograph of the electrolytic copper powder. Electric resistance and electromagnetic wave shielding properties were measured upon hardened coating of each conductive paste obtained thus.

Measurement of Electric Resistance

Figure 1:
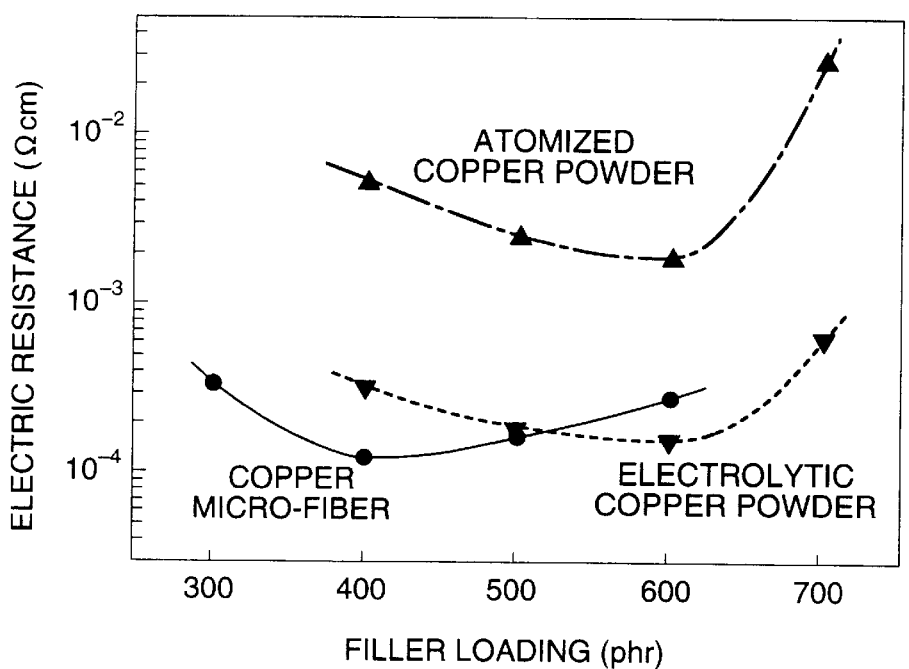
FIG. 1 shows a graph showing the results of measurement of electric resistance of each conductive coating in Example and Comparatives.

After glass substrates were coated with respective conductive pastes obtained thus, the conductive pastes were heated to be hardened at 150° C. for 1 hour. Thus, various conductive coatings were prepared. Electric resistance of each of the conductive coatings was measured by a DC four-terminal method. The results were shown in the graph of FIG. 1. The conductive coating using the copper micro-fiber fillers exhibits lower electric resistance than any other conductive coating. For example, for achieving the electric resistance of $10^{-4}$ Ωcm, the sufficient loading of the copper micro-fiber fillers in the conductive coating is about 400 phr, while the loading of the electrolytic copper powder in the conductive coating needs to be 600 phr. Thus, it is understood that desired electric conductivity can be obtained with a smaller loading if the copper micro-fiber fillers are used.

Measurement of Electromagnetic Wave Shielding Properties

Figure 2:
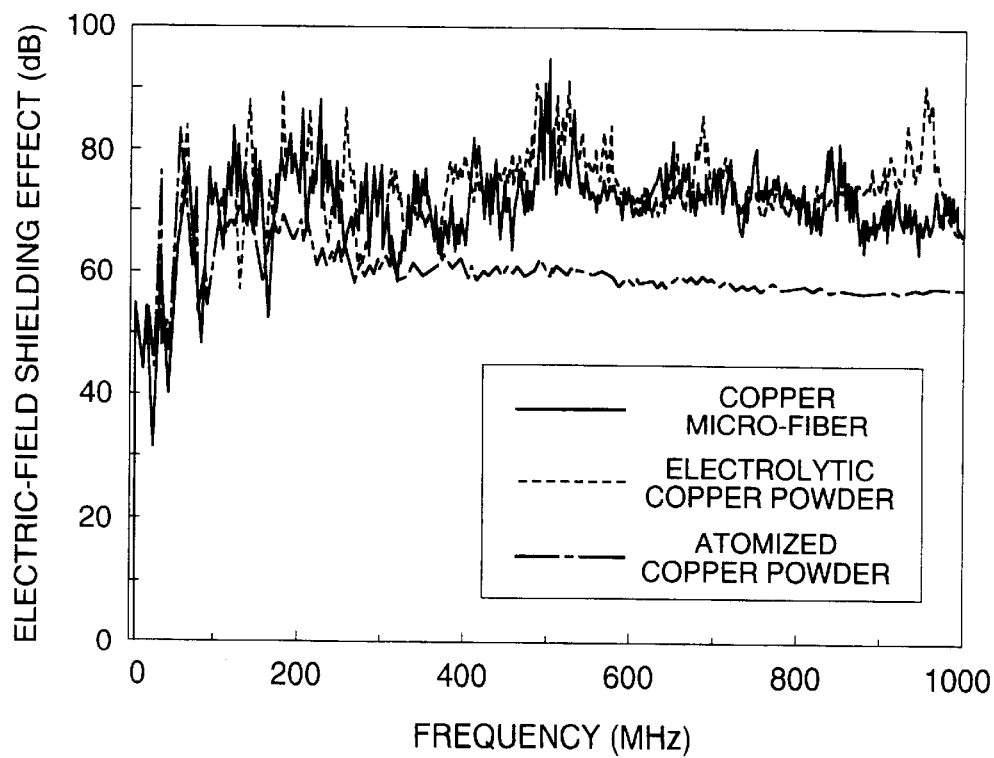
FIG. 2 shows a graph showing the results of measurement, in an electric field mode, of electromagnetic wave shielding properties of each conductive coating in Example and Comparatives.
Figure 3:
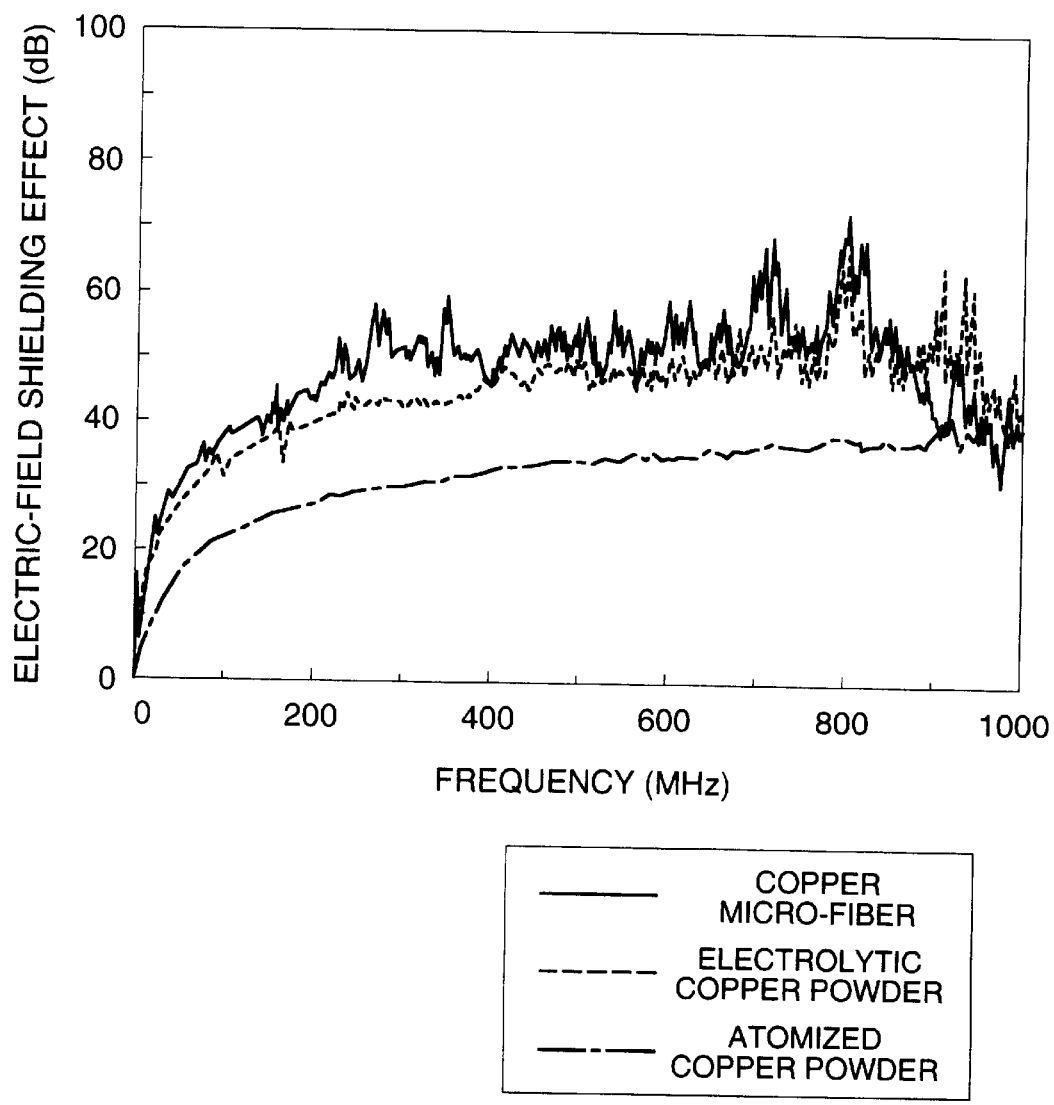
FIG. 3 shows a graph showing the results of measurement, in a magnetic field mode, of electromagnetic wave shielding properties of each conductive coating in Example and Comparatives.

In each conductive paste mentioned above, by using the loading exhibiting the lowest value of electric resistance in the above-mentioned electric resistance measurement, electromagnetic wave shielding properties of the respective conductive pastes were measured by a KEC Method (Kansai Electronic Industry Development Center). That is, a 75 μm-thick PET film was masked by a 0.08 m-thick Teflon tape while leaving a corner area 100 mm by 120 mm. The area was coated with each of the conductive pastes mentioned above. Each of the conductive pastes was heated to be hardened at 150° C. for 1 hour. Thus, various conductive coatings were prepared, and electromagnetic shielding properties of the conductive coatings were measured in a proximity electric field mode and a proximity magnetic field mode. FIG. 2 graphs the measurement results in the proximity electric field mode, and FIG. 3 graphs the measurement results in the proximity magnetic field mode.

As is apparent from FIG. 2, in the electric field mode, the conductive coatings using the copper micro-fiber fillers and the electrolytic copper powder exhibited substantially equally high electromagnetic wave shielding effect in a broad frequency range. The value of the electromagnetic wave shielding effect was 80 to 90 dB at 500 MHz which was the center of the measurement range. On the other hand, the conductive coating using the atomized copper powder, which was low in conductivity, exhibited somewhat low shielding effect. As for the shielding effect in the magnetic field mode, as is apparent from FIG. 3, the conductive coating using the copper micro-fiber fillers was the highest (55 dB at 500 MHz), the conductive coating using the electrolytic copper powder was the second highest (50 dB at 500 MHz), and the conductive coating using the atomized copper powder was likewise the worst (35 dB at 500 MHz).

Also from the measurement results of the electromagnetic wave shielding properties, it is understood that an excellent shielding effect can be obtained with a smaller loading if the copper micro-fiber fillers are used.

As has been described above, according to the present invention, conductive paste having excellent conductivity and excellent electromagnetic wave shielding properties is provided in spite of a smaller loading of conductive fillers than that of conventional conductive paste.

What is claimed is:

1. A method of producing conductive paste comprising the steps of:
    subjecting cuprous chloride to reduction with carbon in an atmosphere containing water vapor and argon gas to form copper micro-fibers;
    shredding the formed copper micro-fibers; and
    adding the shredded copper micro-fibers to one of thermoplastic resin and thermosetting resin.

2. The method according to claim 1, wherein the copper micro-fibers have an average fiber diameter in a range of from 0.1 μm to 25 μm and an average fiber length in a range of from 1 μm to 1,000 μm.

* * * * *